(12) United States Patent
Kryliouk et al.

(10) Patent No.: US 7,001,791 B2
(45) Date of Patent: Feb. 21, 2006

(54) GAN GROWTH ON SI USING ZNO BUFFER LAYER

(75) Inventors: Olga Kryliouk, Gainesville, FL (US); Tim Anderson, Gainesville, FL (US); Kee Chan Kim, Gainesville, FL (US)

(73) Assignee: University of Florida, Gainesville, FL (US)

(*) Notice: Subject to any disclaimer, the term of this patent is extended or adjusted under 35 U.S.C. 154(b) by 35 days.

(21) Appl. No.: 10/691,353

(22) Filed: Oct. 22, 2003

(65) Prior Publication Data

US 2004/0201030 A1 Oct. 14, 2004

Related U.S. Application Data

(60) Provisional application No. 60/462,790, filed on Apr. 14, 2003.

(51) Int. Cl.
  *H01L 21/00* (2006.01)
(52) U.S. Cl. .......................... 438/46; 438/93; 438/104
(58) Field of Classification Search ................. 438/22, 438/46, 47, 93, 104; 257/103, 98
  See application file for complete search history.

(56) References Cited

U.S. PATENT DOCUMENTS

| 6,030,886 A | 2/2000 | Yuri et al. | |
| 2002/0086534 A1* | 7/2002 | Cuomo et al. | 438/689 |

OTHER PUBLICATIONS

Pearton et al., "GaN: Processing, defects, and devices," Journal of Applied Physics, 86:1-78, 1999.
Pearton et al., "Fabrication and performance of GaN electronic devices," Materials Science and Engineering: R: Reports, 30:1-137, 2000.
Kim et al., "Growth of high-quality GaN on Si(111) substrate by ultrahigh vacuum chemical vapor deposition," Applied Physics Letters, 78:2858-2860, 2001.
Krost et al., "GaN-Based Devices on Si," Phys. Stat. Sol., 194:361-375, 2002.
Wang et al., "Growth of hexagonal GaN on Si(111) coated with a thin flat SiC buffer layer," Applied Physics Letters, 77:1846-1848, 2000.
Zamir, "The effect of AlN buffer layer on GaN grown on (111)-oriented Si substrates by MOCVD," Journal of Crystal Growth, 218:181-190, 2000.
Ueda et al., "Vapor phase epitaxy growth of GaN on pulsed laser deposited ZnO buffer layer," Journal of Crystal Growth, 187:340-346, 1998.
Gu et al., "Role of Interfacial compound formation associated with the use of ZnO buffers layers in the hydride vapor phase epitaxy of GaN," Applied Physics Letters, 76:3454-3456, 2000.
Molnar et al., "Growth of gallium nitride by hydride vapor-phase epitaxy," Journal of Crystal Growth, 178:147-156, 1997.
Detchprohm et al., "Hyride vapor phase epitaxial growth of a high quality GaN film using a ZnO buffer layer," Appl. Phys. Lett., 61:2688-2690, 1992.

(Continued)

*Primary Examiner*—Hsien-Ming Lee
(74) *Attorney, Agent, or Firm*—Akerman Senterfitt

(57) ABSTRACT

A method for forming group III-N articles includes the steps of providing a single crystal silicon substrate, depositing a zinc oxide (ZnO) layer on the substrate, and depositing a single crystal group III-N layer on the ZnO layer. At least a portion of the group III-N layer is deposited at a temperature of less than 600° C.

8 Claims, 12 Drawing Sheets

OTHER PUBLICATIONS

Strittmatter et al., "LP-MOCVD growth of GaN on silicon substrates-comparison between AlAs and ZnO nucleation layers," Materials Science and Engineering, 59:29-32, 1999.

Lee et al., "The Application of a Low Temperature GaN Buffer Layer to Thick GaN Film Growth on ZnO/Si Substrate," Phys. Stat. Sol., 176:583-587, 1999.

Dehoff, R., "Thermodynamics in Materials Science," McGraw Hill, 326-327, 1993.

Molnar et al., "Gallium Nitride Thick Films Grown by Hydride Vapor Phase Epitaxy," Mat. Res. Soc. Symp., 423:221-226, 1996.

* cited by examiner

PRIOR ART

RMS: 35.2 nm

RMS: 114.27 nm

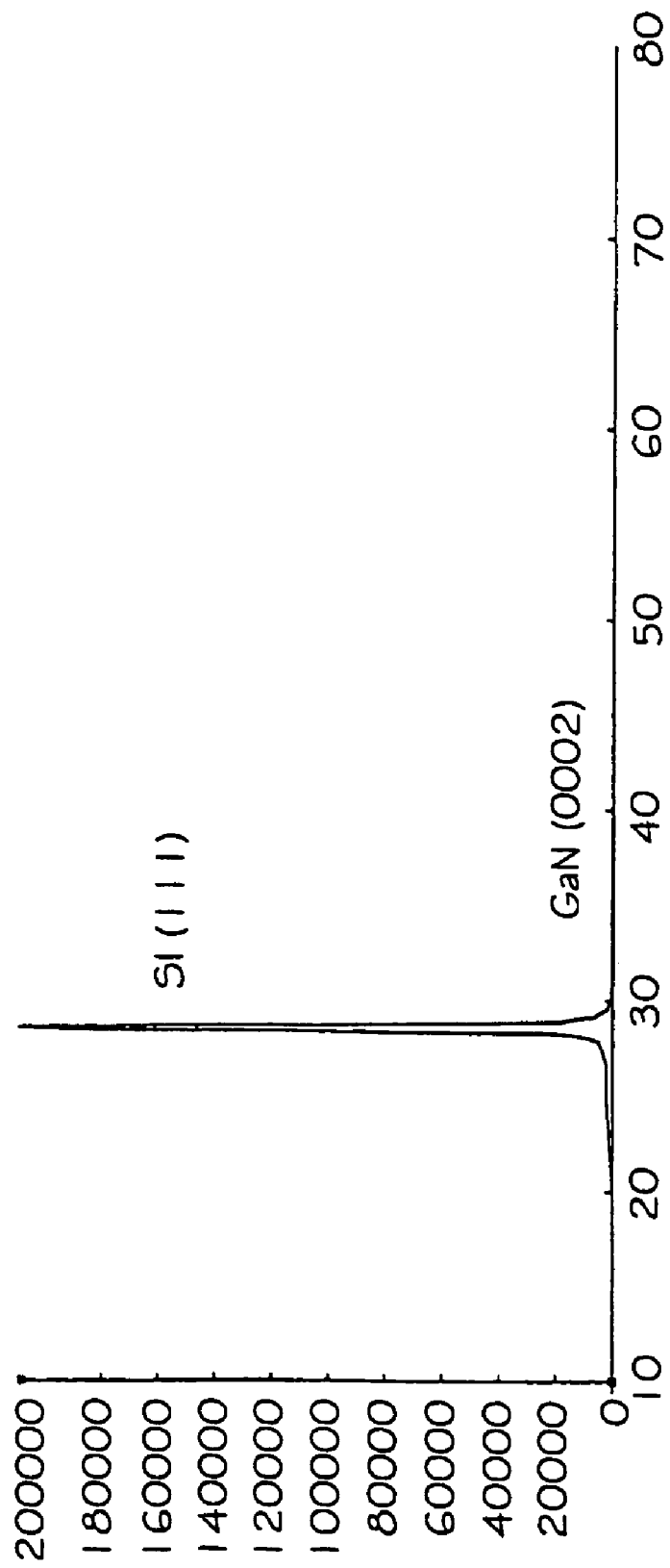

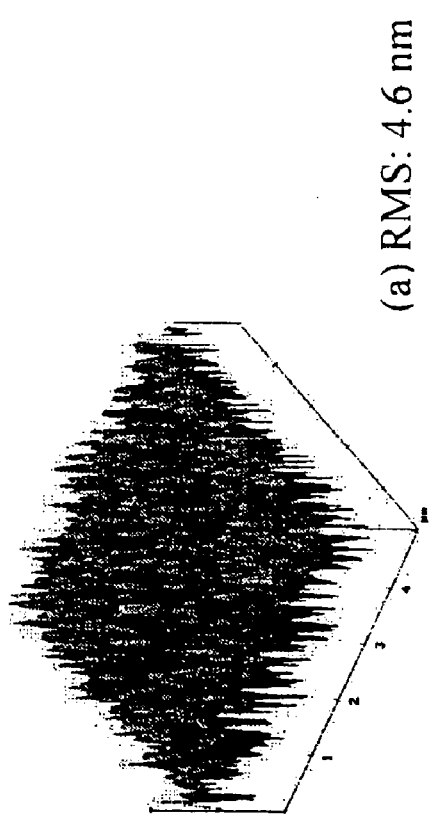
FIG. 5(b)  b) RMS: 4.7 nm
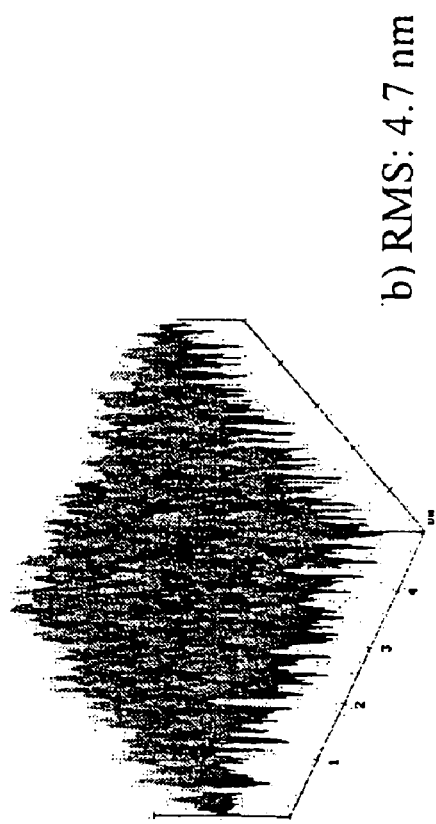
FIG. 5(a)  (a) RMS: 4.6 nm

PL spectrum of GaN/ZnO/Si

GAN GROWTH ON SI USING ZNO BUFFER LAYER

CROSS-REFERENCE TO RELATED APPLICATIONS

This application claims priority to the U.S. Provisional Application No. 60/462,790 entitled "GaN GROWTH ON Si USING ZnO BUFFER LAYER" filed Apr. 14, 2003, which is incorporated herein by reference in its entirety.

STATEMENT REGARDING FEDERALLY SPONSORED RESEARCH OR DEVELOPMENT

Not applicable.

FIELD OF THE INVENTION

The invention relates to the field of thin film based devices, and more specifically, to a method of improving the quality of the thin film which has poor lattice matching with the substrate onto which it is to be deposited.

BACKGROUND OF THE INVENTION

Gallium nitride (GaN) and its related alloys have been under intense research in recent years due to their promising applications in electronic and optoelectronic devices. Particular examples of potential optoelectronic devices include blue light emitting and laser diodes, and UV photodetectors. Their large bandgap and high electron saturation velocity also make them excellent candidates for applications in high temperature and high-speed power electronics.

Due to the high equilibrium pressure of nitrogen at growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material which exhibits close lattice matching and close matching of thermal expansion coefficients. Presently, (0001) oriented sapphire is the most frequently used substrate for GaN epitaxial growth due to its low price, availability of large-area wafers with good crystallinity and stability at high temperatures. The lattice mismatch between GaN and sapphire is over 13%. Such huge mismatch in the lattice constants causes poor crystal quality if GaN films were to be grown directly on the sapphire, due to stress formation and a high density of defects, including such defects as microtwins, stacking faults and deep-levels. Typically, these GaN thin films exhibit wide X-ray rocking curve, rough surface morphology, high intrinsic electron concentration and significant yellow luminescence.

Silicon substrates have been considered for use as substrates for growth of GaN films. Silicon substrates for GaN growth is attractive given its low cost, large diameter, high crystal and surface quality, controllable electrical conductivity, and high thermal conductivity. The use of Si wafers promises easy integration of GaN based optoelectronic devices with Si based electronic devices. GaN-based devices have been demonstrated on Si. The direct growth of GaN on substrates such as Si, however, has resulted in substantial diffusion of Si into the GaN film, relatively high dislocation density (~$10^{10}$ $cm^{-2}$) and cracking of the GaN film. GaN is also known to poorly nucleate on Si substrate, leading to an island-like GaN structure and poor surface morphology. Thus, the quality of GaN films grown on silicon has been far inferior to that of films grown on other commonly used substrates such as sapphire or silicon carbide. Moreover, the growth conditions that have been used for GaN on Si are not compatible with standard silicon processes (e.g. the growth temperature is too high).

Numerous different buffer layers have been disclosed for insertion between the substrate and the GaN layer to relieve lattice strain and thus improve GaN crystal quality. ZnO has previously been tested as a buffer layer for Hydride Vapor Phase Epitaxy (HVPE) growth of GaN on sapphire. GaN growth on ZnO/Si structures has also been reported. In general, the use of a ZnO buffer layer produced good quality GaN on both Si and sapphire substrates, even though ZnO is known to be thermally unstable at the high growth temperature of GaN. For ZnO/Si, no continuous two-dimensional GaN layer could be obtained without first growing a low temperature GaN buffer layer to prevent the thermal decomposition of ZnO. HVPE grown GaN films on ZnO/sapphire without this low temperature GaN buffer layer exhibited cracks and peeling when thick (about 200 nm, or more) ZnO buffer layer were grown. It was suggested that the thermal decomposition of ZnO led to the growth of poor quality GaN.

SUMMARY OF THE INVENTION

A layered group III-N article includes a silicon single crystal substrate, a single crystal zinc oxide (ZnO) buffer layer disposed on and in contact with the substrate, and a single crystal group III-N layer disposed on the ZnO buffer layer. The group III-N layer can comprise GaN and is preferably an epitaxial layer. The thickness of the ZnO layer can be less than 200 angstroms, such as 100 angstroms, or less than 100 angstroms.

As used herein, the term "single crystal" as applied to both the ZnO comprising buffer layer and the group III-nitride layer refers to a layer which provides a full width half maximum (FWHM) X-ray ω-scan rocking curve of no more than 200 arc-min, more preferably less than 120 arc-min, and most preferably less than 70 arc-min.

A light-emitting diode (LED) includes a silicon (111) single crystal substrate, a zinc oxide (ZnO) comprising layer on the substrate, a single crystal group III-nitride semiconductor epitaxial layer disposed on the ZnO layer, and an active layer on the group III-nitride layer. The ZnO layer can be a single crystal. The group III-nitride layer can comprise GaN. In a preferred embodiment of the invention, one terminal of said LED is contacted through the silicon substrate. The LED can further comprise a first and second cladding layer sandwiching the active layer. The active layer can comprise $In_xGa_{1-x}N$, wherein $0 \leq X \leq 1$, or related variants.

A method for forming group III-N based articles includes the steps of providing a single crystal silicon substrate, and depositing a zinc oxide (ZnO) layer on the substrate. In one embodiment, the zinc oxide (ZnO) layer is deposited by a process comprising pulsed laser deposition.

A single crystal group III-N layer is then deposited on the ZnO layer, wherein at least a portion of the group III-N deposition step is performed at a temperature of less than 600° C. The step of depositing the group III-N layer can comprise depositing a seed layer at a temperature of no more than 600° C., followed by a step of depositing another portion of the group III-N layer at a temperature of more than 600° C. In a preferred embodiment, the surface of the ZnO layer is treated with a gallium comprising gas, such as triethyl gallium, before beginning the step of depositing the group III-N layer.

BRIEF DESCRIPTION OF THE DRAWING

A fuller understanding of the present invention and the features and benefits thereof will be accomplished upon review of the following detailed description together with the accompanying drawings, in which:

FIGS. 5(a) and (b) are AFM images for a GaN surface on base Si and ZnO/Si, respectively, demonstrating that surface roughness decreases significantly when a ZnO buffer layer is included.

DETAILED DESCRIPTION OF THE INVENTION

Figure 1A:
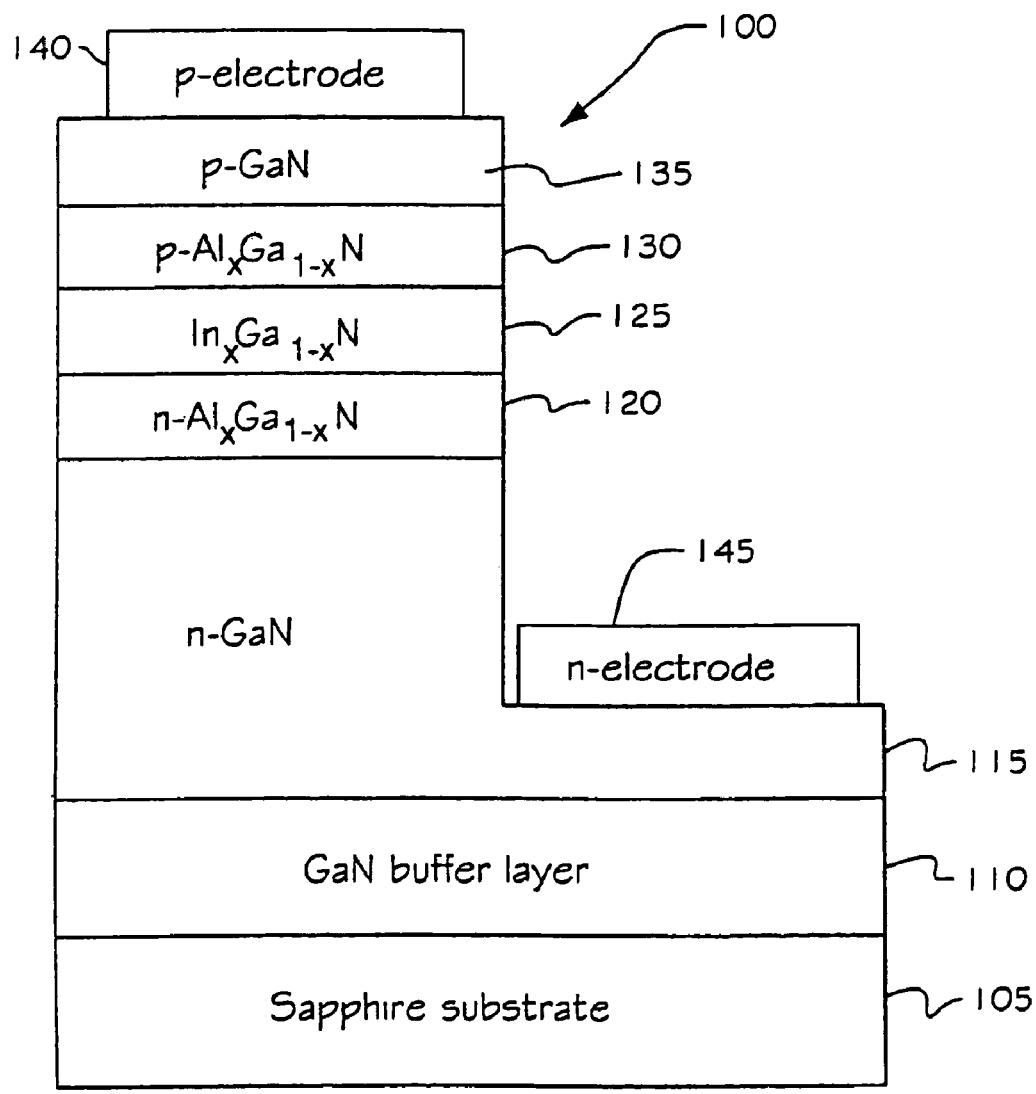
FIG. 1(a) shows a prior art GaN LED.

A layered group III-N article includes a silicon single crystal substrate, a single crystal zinc oxide (ZnO) buffer layer disposed on and in contact with the substrate, and a single crystal group III-N layer disposed on the ZnO buffer layer. The group III-N layer is an epitaxial layer and preferably comprises GaN. The thickness of the ZnO layer can be 200 angstroms, or less. For example, the ZnO thickness can be 100 angstroms. However, ZnO buffer layers which are at least 200 angstroms have been found to produce better crystal quality. The ZnO layer can be doped. For example, Al, B or Ga can be used to n-type dope the ZnO layer.

The ZnO buffer layer and GaN deposition processes described herein were found to improve the quality of GaN grown on Si substrates. However, the invention can be used with other substrates as well as other group III-N species.

It has been found that exposure of the ZnO buffer layer to $NH_3$ used in a conventional GaN deposition at temperature of about 600° C., or higher, results in the decomposition of ZnO and the resulting poor nucleation of group III-N layers, such as GaN. In one embodiment, at least the initial GaN layer is deposited at a temperature of less than 600° C., such as 560° C. In a related embodiment, a GaN seed layer, such as a 5 to 10 nm thick seed layer, is first deposited at a temperature of less than about 600° C., followed by a higher temperature deposition process for the remainder of the GaN layer. Use of a seed layer for at least the initial portion of the GaN deposition process, has been found to substantially avoid $NH_3$ induced decomposition of ZnO and subsequent poor nucleation of GaN. Following the deposition of an initial GaN "seed layer", the remainder of the GaN layer can be deposited at a higher temperature, such as at least 850° C. to obtain improved GaN crystal quality. The seed layer is generally 5–10 nm thick. In a preferred embodiment of the invention, the ZnO surface is first treated with a gallium comprising reactant (such as triethyl gallium; TEGa) before turning on the $NH_3$, such as for 30 seconds before initiating the flow of $NH_3$ during the GaN deposition step.

ZnO films can be deposited by a variety of methods. Preferably, a process comprising pulsed laser deposition (PLD) is used fro ZnO deposition. The group III-N layer can also be deposited by a variety of methods. Preferably, MOCVD is used to grow the group III-N film, such as GaN. However, the invention is not limited to these specific processes. In addition, one or more layers can be disposed between the GaN layer and the ZnO layer.

The invention can be used to form a variety of discrete or integrated devices, such as diodes, transistors, optical and optoelectronic devices or integrated circuits including the same.

The ZnO buffer layer is a semiconducting layer. Combined with a silicon substrate, the ZnO buffer layer permits formation of simplified processing as compared to prior art processes, such as demonstrated below for a GaN-based LED.

FIG. 1(a) shows a prior art GaN-based LED 100 on a sapphire substrate 105. A buffer layer 110 is disposed between the substrate 105 and an n-GaN layer 115. An n-$Al_xGa_{1-x}$N cladding layer 120 is shown on the GaN layer 115. An $In_xGa_{1-x}$N active layer 125 is disposed on $Al_xG_{1-x}$N layer 120. An $Al_xG_{1-x}$N cladding layer 130 is disposed on the $In_xG_{1-x}$N later 125. A p-GaN layer 135 is disposed on the AlxGayN cladding layer 130. p-electrode 140 provides contact to p-GaN layer 135. Since the sapphire substrate 105 is electrically insulating, even though buffer layer 110 may be semiconducting or conducting, a contact to n-GaN layer 115 via n-electrode 145 requires etching a contact through layers 135, 130, 125 and 120. The etching process required significant added processing cost and process complexity as compared to LED 150 shown in FIG. 1(b).

Figure 1B:
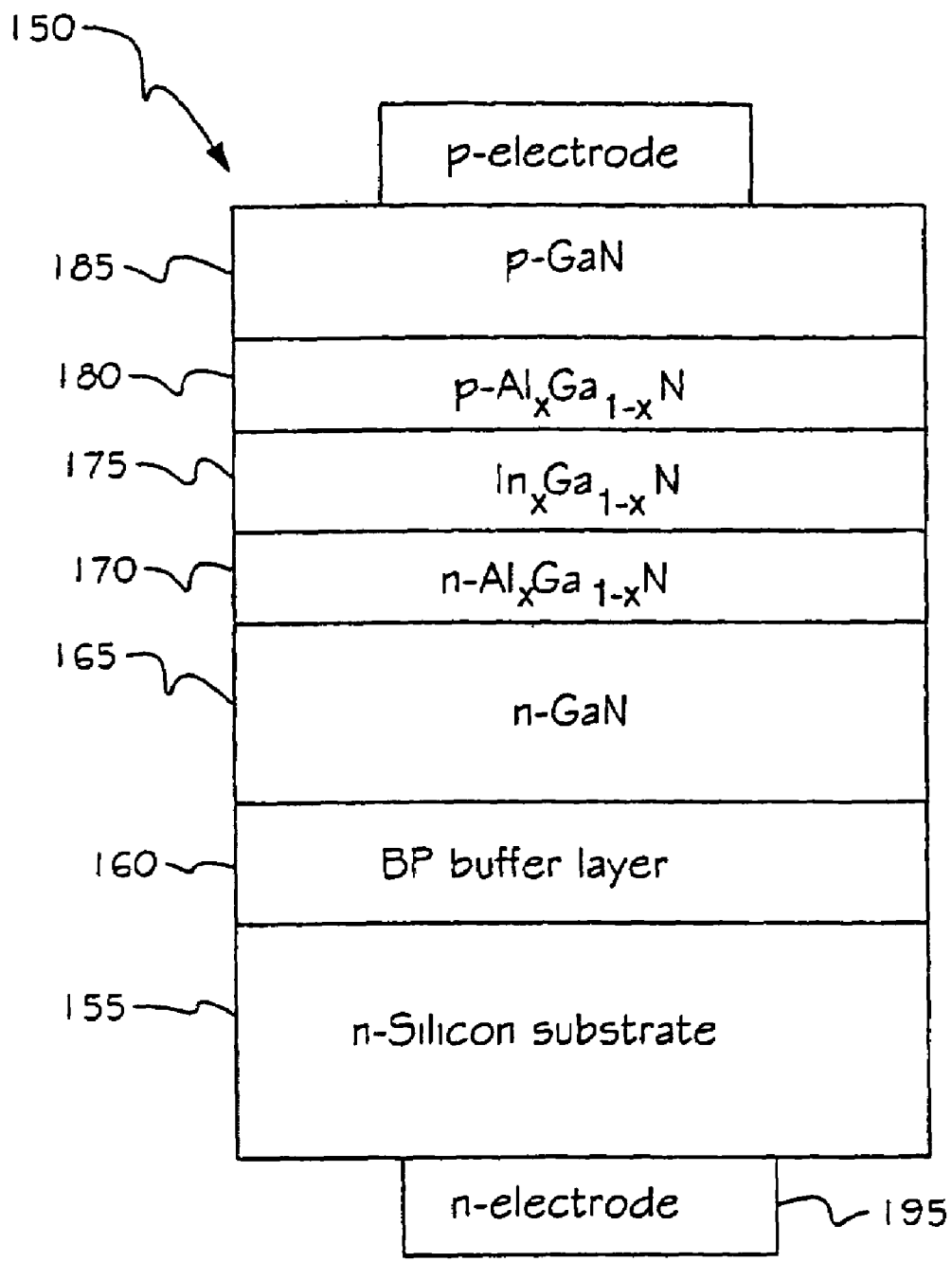
FIG. 1(b) shows a GaN LED according to an embodiment of the invention.

FIG. 1(b) show an LED 150 on a silicon substrate 155, according to an embodiment of the invention. A semiconducting buffer layer 160, such as a ZnO layer is disposed between substrate 155 and n-GaN layer 165. An n-$Al_xGa_{1-x}$N cladding layer 170 is shown on the GaN layer 165. An $In_xG_{1-x}$N active layer 175 is disposed on $Al_xG_{1-x}$N layer 170. An $Al_xG_{1-x}$N cladding layer 180 is disposed on the $In_xGa_{1-x}$N later 175. A p-GaN layer 185 is disposed on the $Al_xGa_{1-x}$N cladding layer 180. Contact to p-GaN layer 185 is provided by p-electrode 190. Since the silicon substrate 155 and buffer layer 160 are both at least semiconducting, n-electrode contact layer 195 can be disposed on silicon substrate 155, such as via a backside contact. Thus, the etching process discussed relative to LED 100 shown in FIG. 1(a) is not required. This arrangement can significantly reduce processing cost and process complexity, and likely improve performance, as compared to LED 100 shown in FIG. 1(a).

EXAMPLES

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

ZnO buffer layers were deposited on Si(100) and Si(111) by Pulsed Laser Deposition (PLD). The Si substrates were first degreased with trichloroethylene (TCE), acetone, methanol and warm water for 3 min each and then treated with a buffer oxide etch (BOE) solution to remove the native oxide layer before they were loaded into the PLD system. A commercially available ZnO-target was used and the samples were annealed in an oxygen atmosphere after growth. Typical growth conditions for PLD growth of ZnO on Si are listed in Table 1.

TABLE 1

PLD growth conditions of ZnO on Si

| | | |
|---|---|---|
| Growth Conditions | Substrate temperature (° C.) | 600 |
| | $O_2$ ambient pressure (mTorr) | 3.6 |
| | Target type | ZnO |
| KrF Excimer Laser ($\lambda$ = 248 nm) | Laser fluence range (mJ/cm$^2$) | 700 |
| | Repetition rate (Hz) | 5 |
| | Pulse duration (ns) | 25 |
| Post Growth Annealing | Cooling rate (° C./min) | −5 |
| | $O_2$ ambient pressure (Torr) | 300 |
| | UV lamp | UV off @ 300° C. |

GaN films were then deposited on ZnO/Si in a low pressure, horizontal, cold wall MOCVD system using triethyl gallium (TEGa) and $NH_3$ as precursors and nitrogen as a carrier gas. The growth temperature was varied from 600° to 850° C. and the growth pressure was fixed at 100 Torr. The low growth temperature was used to prevent, or at least substantially reduce, the thermal decomposition of ZnO buffer layer. The flow rates of TEGa and $NH_3$ were 50 and 1600 sccm, respectively, to provide a V/III ratio of 3500. The resulting crystal orientation and surface morphology of PLD grown ZnO were found to not be affected by Si substrate orientation.

Figure 2A:
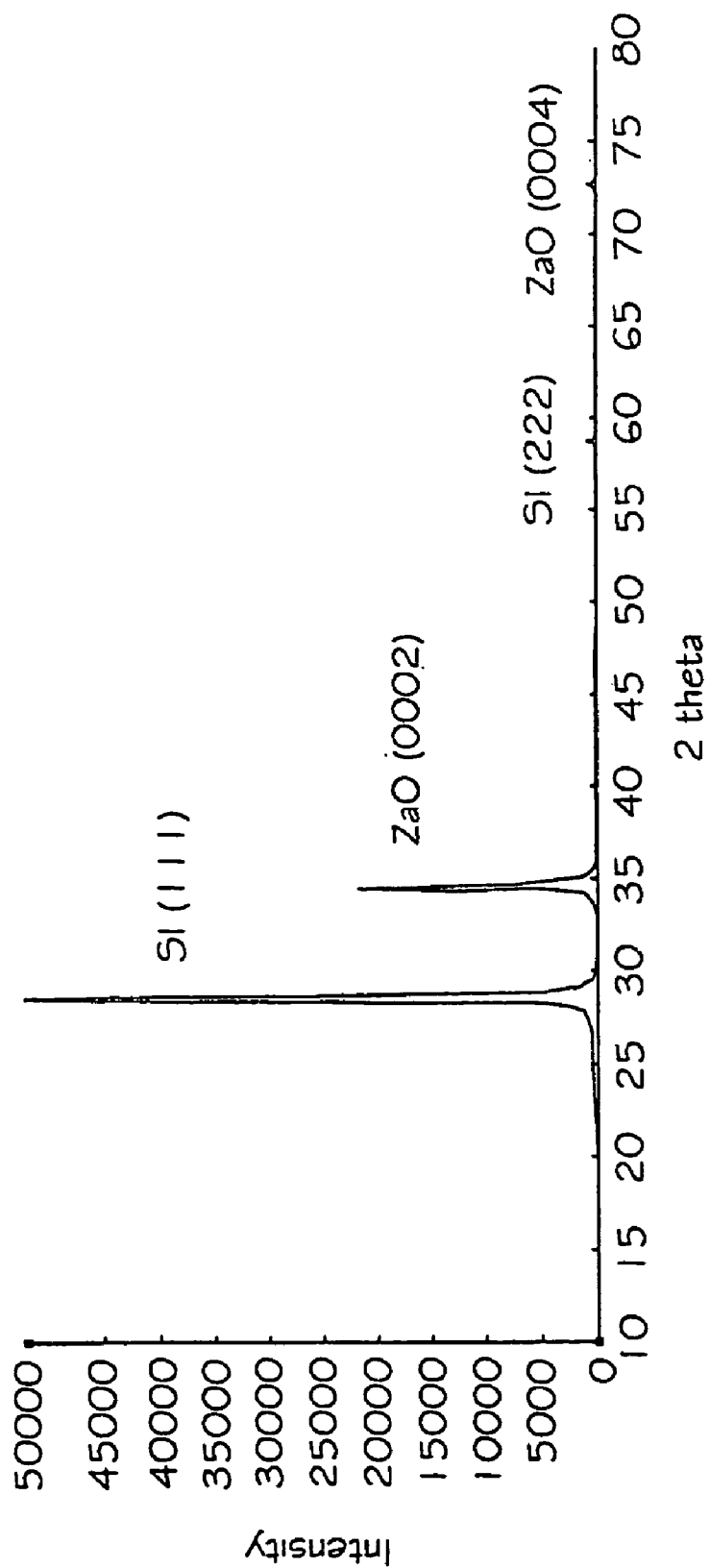
FIGS. 2(a) and (b) are low resolution X-ray diffraction (LRXRD) spectra obtained for ZnO on Si(100) and Si(111), respectively, both indicating that single crystal ZnO(0001) was grown.
Figure 2B:
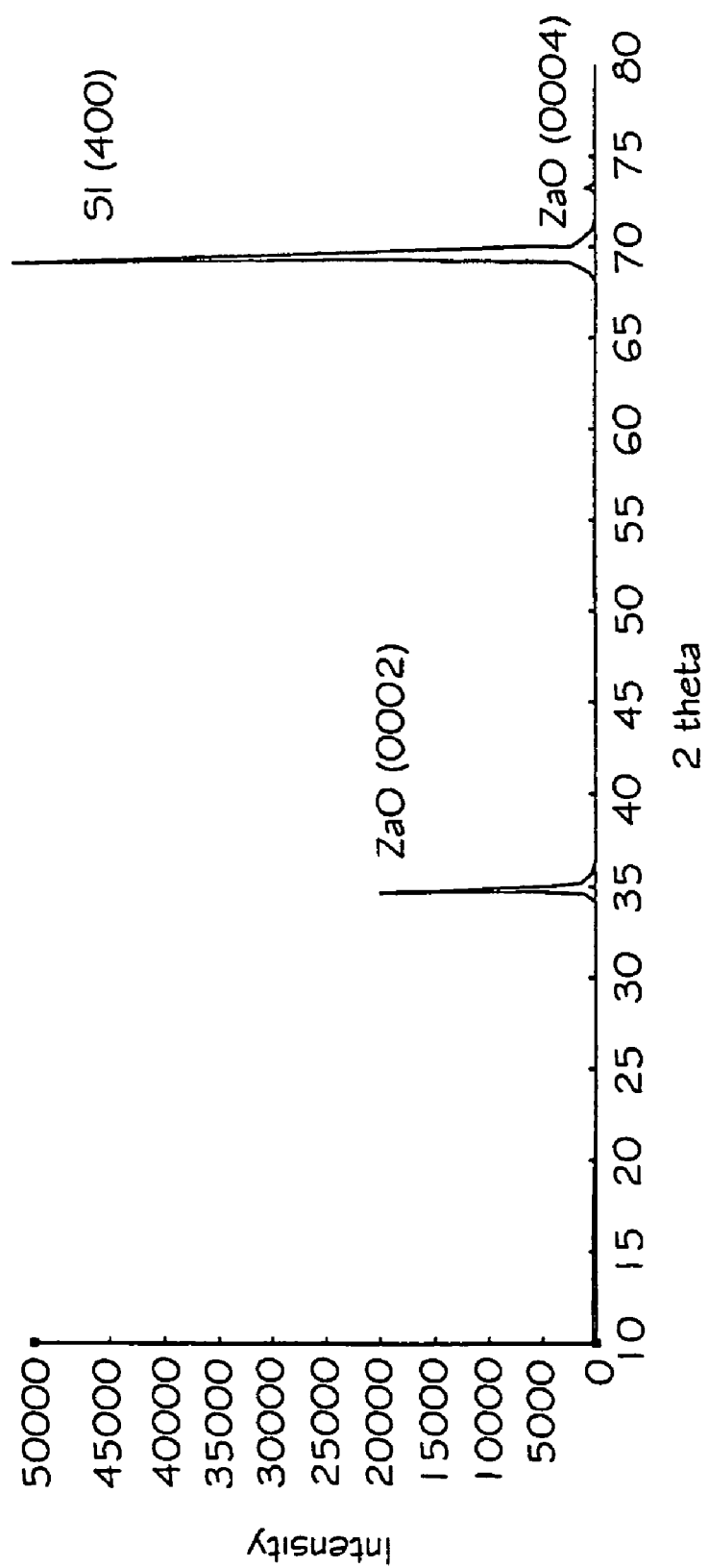
Figure 3B:
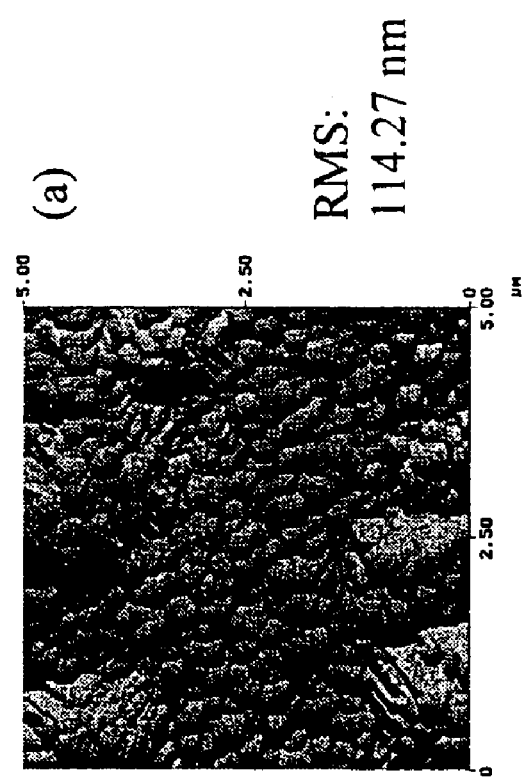
FIGS. 3(a) and (b) are AFM images demonstrating almost identical film roughness with a RMS surface roughness of approximately 4.7 nm for ZnO on both Si(100) and Si(111), respectively.
Figure 3A:
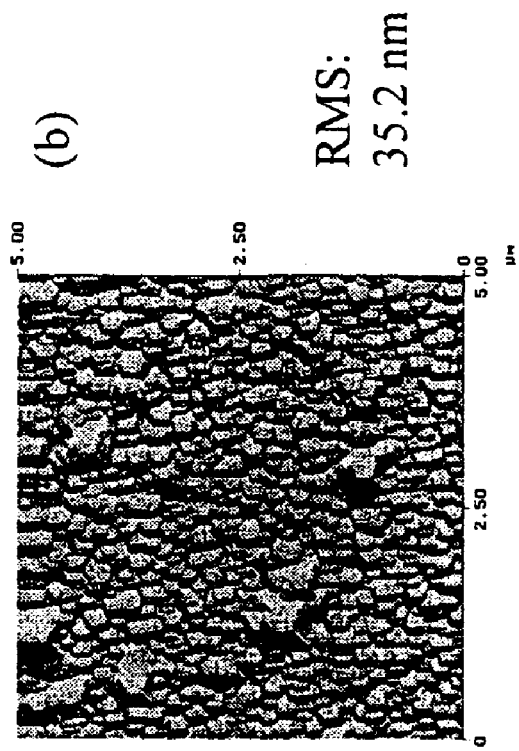

FIGS. 2(a) and (b) are LRXRD spectra obtained for ZnO on Si(100) and Si(111), respectively, both indicating that single crystal ZnO(0001) was grown. FIGS. 3(a) and (b) are AFM images demonstrating almost identical film roughness with a RMS surface roughness of approximately 4.7 nm for ZnO on both Si(100) and Si(111), respectively.

Figure 4B:
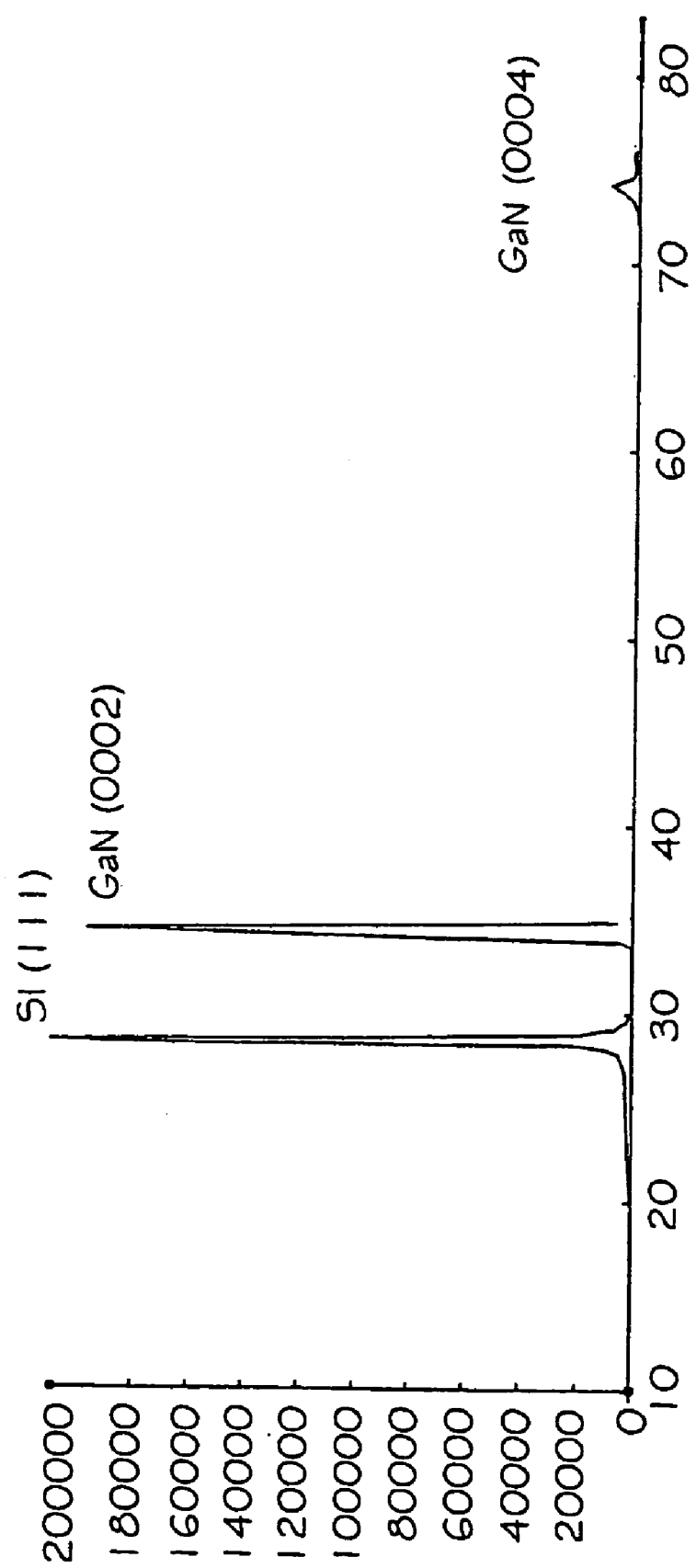
FIGS. 4(a) and (b) are LRXRD spectra of GaN on bare Si and ZnO/Si, respectively.

The use of a ZnO buffer layer was found to improve the structural quality and surface morphology of MOCVD GaN films grown thereon. FIGS. 4(a) and (b) compare LRXRD spectra of GaN on bare Si and ZnO/Si, respectively. The intensity of GaN(0002) reflection from GaN/ZnO/Si shown in FIG. 4(b) is much higher than that of GaN/Si shown in FIG. 3(a).

FIGS. 5(a) and (b) show the GaN surface roughness on bare silicon and on ZnO/Si, respectively. FIGS. 5(a) and (b) demonstrate that GaN surface roughness decreases significantly when a ZnO buffer layer was employed compared to a bare Si substrate. It is noted that both samples were grown in the same run.

Figure 6:
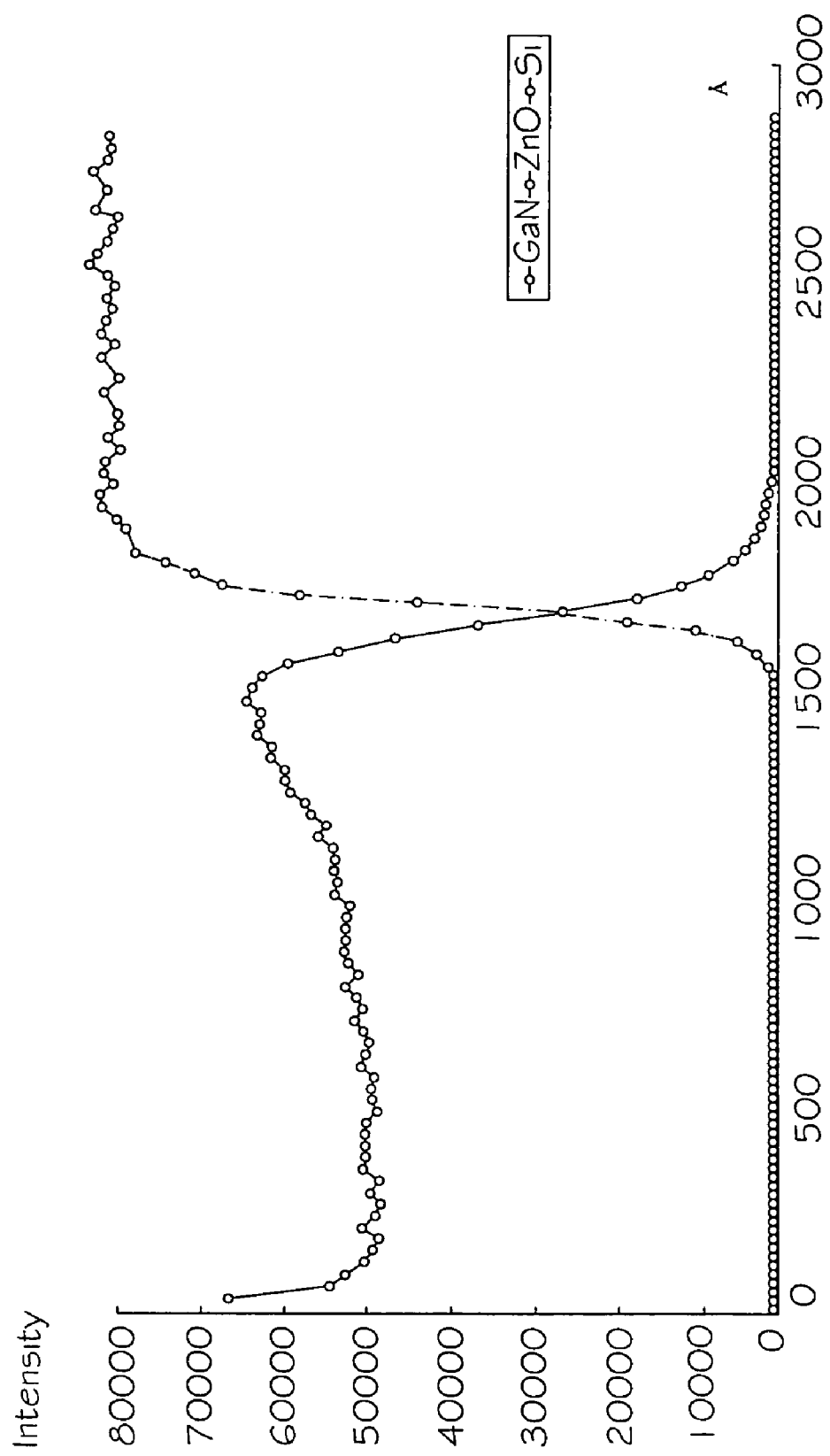
FIG. 6 is a SIMS depth profile demonstrating no detectable ZnO at the GaN/Si interface when ZnO was exposed to $NH_3$ at 850° C. during GaN deposition.

The thermal stability of ZnO as a buffer layer for GaN growth was also examined. Thermodynamically, the equilibrium oxygen partial pressure above ZnO at 850° C. is about $10^{-23}$ atm. The decomposition of a ZnO film on Si was observed to be negligible when annealed at 850° C. and 100 Torr in a nitrogen atmosphere for 5 min. When the same film was exposed to $NH_3$ at 850° C. for 5 min, decomposition of ZnO was noticeable, which leads to poor nucleation of GaN. FIG. 6 is a SIMS depth profile of this sample subjected to $NH_3$ at 850° C. for 5 min which demonstrates the removal of ZnO and as a result no detectable ZnO remaining at the Si/ZnO/GaN interface following $NH_3$ exposure which explains the poor nucleation of GaN observed.

Figure 7:
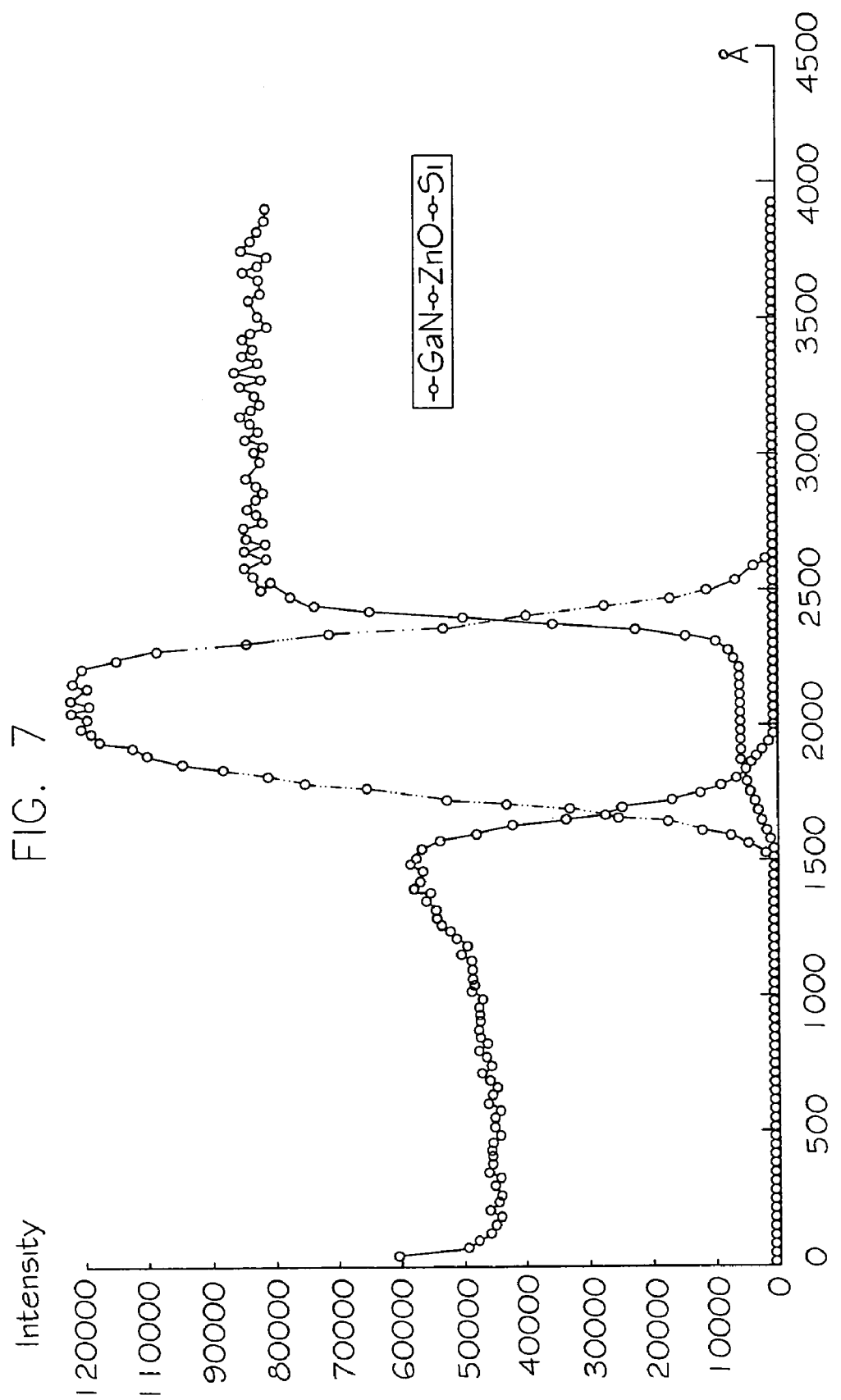
FIG. 7 is a SIMS depth profile demonstrating the presence of a ZnO layer beneath a GaN layer when the GaN layer is grown at 600° C.

The best surface morphology of GaN was obtained with a ZnO layer of about 65 nm thick, although thicker ZnO layers (e.g. 200 nm) have been found to produce no detectable cracking or peeling from the Si surface. FIG. 7 is SIMS data showing no evidence of ZnO removal when a GaN seed layer is first grown at 600° C.

Figure 8A:
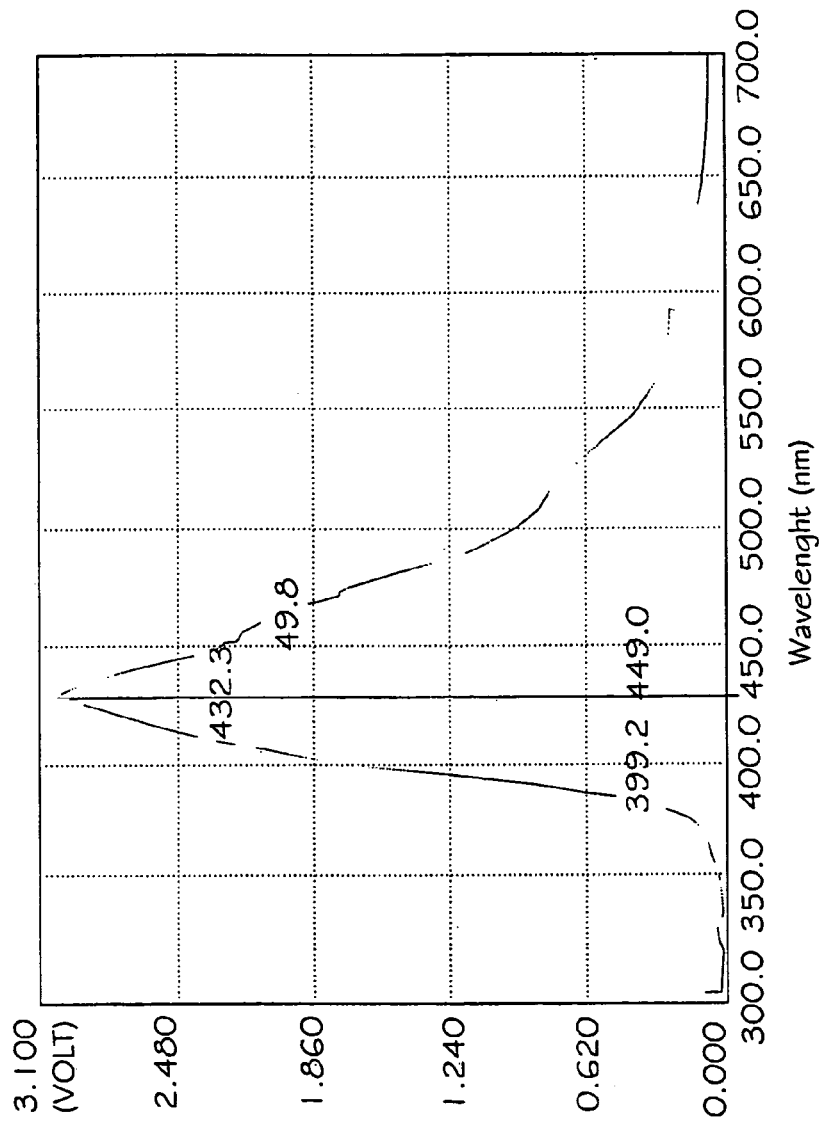
FIGS. 8(a) and (b) show the room temperature photoluminescence (PL) of GaN/ZnO/Si and GaN/Si, respectively evidencing p-doping of the GaN layer by Zn provided by the ZnO layer.
Figure 8B:
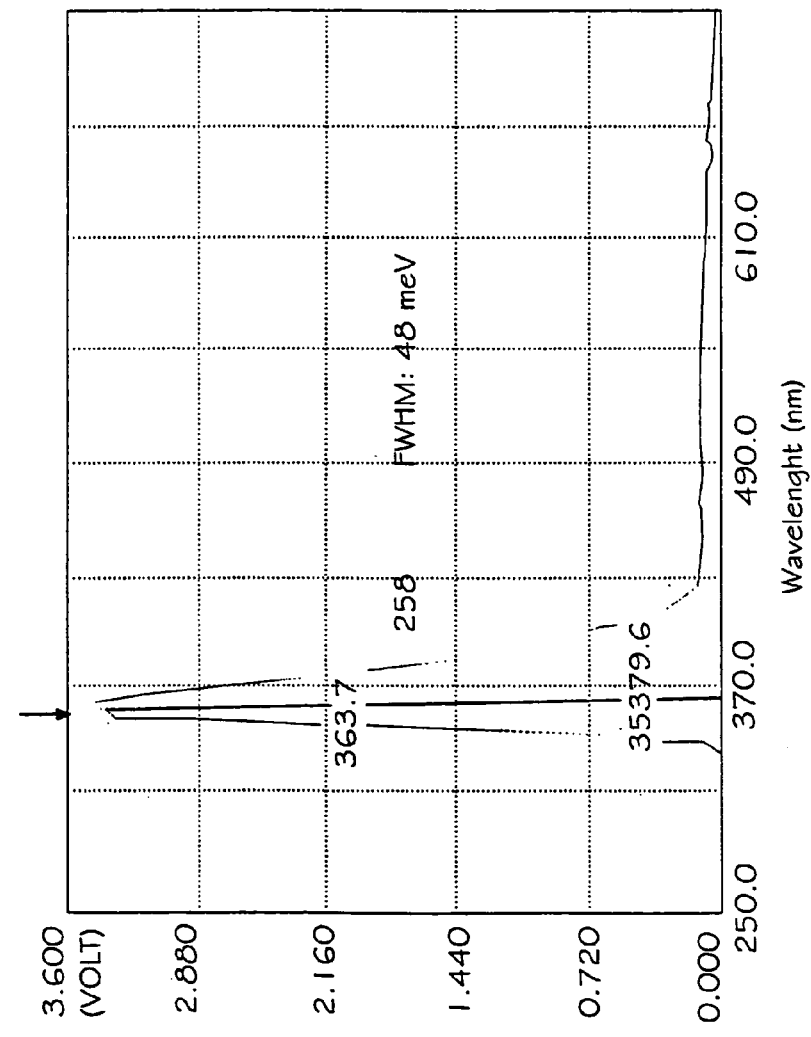

FIGS. 8(a) and (b) show the room temperature photoluminescence (PL) of an article comprising GaN/ZnO/Si and GaN/Si, respectively. PL was performed exciting the sample a with 325 nm He—Cd laser, 6.9 mW, slit width 0.100 nm. The intensity of the band-edge emission peak at 3.41 eV shown in FIG. 8(b) is high and comparable to GaN grown on sapphire. The defect related yellow band emission is not evident in either FIG. 8(a) or (b). The shift in the PL spectrum in FIG. 8(a) as compared to the PL spectrum shown in FIG. 8(b) resulting from the inclusion of the ZnO buffer indicates that zinc from the ZnO buffer layer p-doped the GaN layer during GaN deposition.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. A method for forming group III-N based articles, comprising the steps of:
   providing a single crystal silicon substrate;
   depositing a single crystal zinc oxide (ZnO) layer on said substrate, and
   depositing a single crystal group III-N layer on said ZnO layer, wherein at least a portion of said step of depositing group III-N layer is performed at a temperature of less than 600° C.

2. The method of claim 1, wherein said step of depositing said group III-N layer comprises depositing a seed layer at a temperature of no between 600° C. and 850° C., followed by a step of depositing another portion of said group III-N layer at a temperature of more than 600° C.

3. The method of claim 1, further comprising the step of treating said ZnO layer with a gallium comprising gas before said step of depositing said group III-N layer.

4. The method of claim 3, wherein said gallium comprising gas comprises triethyl gallium.

5. The method of claim 1, wherein said group III-N layer comprises GaN.

6. The method of claim 1, wherein said group III-N layer is an epitaxial layer.

7. The method of claim 1, wherein a thickness of said ZnO layer is less than 200 angstroms.

8. The method of claim 1, wherein said step of depositing a zinc oxide (ZnO) layer comprises pulsed laser deposition.

* * * * *